(12) United States Patent
Won et al.

(10) Patent No.: US 9,029,244 B2
(45) Date of Patent: May 12, 2015

(54) APPARATUS INCLUDING 4-WAY VALVE FOR FABRICATING SEMICONDUCTOR DEVICE, METHOD OF CONTROLLING VALVE, AND METHOD OF FABRICATING SEMICONDUCTOR DEVICE USING THE APPARATUS

(71) Applicants: Samsung Electronics Co., Ltd., Suwon-si (KR); Genitech, Inc., Daejeon (KR)

(72) Inventors: Seok-jun Won, Seoul (KR); Yong-min Yoo, Daejeon Metropolitan (KR); Dae-youn Kim, Daejeon Metropolitan (KR); Young-hoon Kim, Daejeon Metropolitan (KR); Dae-jin Kwon, Suwon-si (KR); Weon-hong Kim, Suwon-si (KR)

(73) Assignees: Samsung Electronics Co., Ltd., Suwon-si (KR); Genitech, Inc., Daejeon (KR)

( * ) Notice: Subject to any disclaimer, the term of this patent is extended or adjusted under 35 U.S.C. 154(b) by 0 days.

(21) Appl. No.: 13/624,609
(22) Filed: Sep. 21, 2012

(65) Prior Publication Data
US 2013/0029477 A1    Jan. 31, 2013

Related U.S. Application Data

(60) Continuation of application No. 12/980,633, filed on Dec. 29, 2010, now abandoned, which is a division of application No. 11/321,491, filed on Dec. 29, 2005, now abandoned.

(30) Foreign Application Priority Data

Jan. 19, 2005 (KR) .................. 10-2005-0005074
Aug. 22, 2005 (KR) .................. 10-2005-0076968

(51) Int. Cl.
*H01L 21/205* (2006.01)
*C23C 16/455* (2006.01)
(Continued)

(52) U.S. Cl.
CPC ....... *C23C 16/45544* (2013.01); *H01L 21/0262* (2013.01); *H01L 21/00* (2013.01); *C23C 16/45561* (2013.01)

(58) Field of Classification Search
CPC . H01L 21/00; H01L 21/0262; H01L 21/2381; H01L 21/28556
USPC ......... 438/478, 477, 483, 680, 681, 689, 758; 118/716, 693
See application file for complete search history.

(56) References Cited

U.S. PATENT DOCUMENTS

| | | | |
|---|---|---|---|
| 4,906,257 A | | 3/1990 | Fukunaga et al. |
| 4,907,534 A | * | 3/1990 | Huang et al. ............ 118/725 |

(Continued)

FOREIGN PATENT DOCUMENTS

| | | |
|---|---|---|
| EP | 0 314 299 | 5/1989 |
| EP | 0 511 115 | 10/1992 |

(Continued)

OTHER PUBLICATIONS

Japanese Office Action dated Feb. 14, 2012, issued in corresponding Japanese Application No. 2006-010304.

(Continued)

*Primary Examiner* — Thinh T Nguyen
(74) *Attorney, Agent, or Firm* — Sughrue Mion, PLLC

(57) ABSTRACT

An apparatus and method for fabricating a semiconductor device using a 4-way valve with improved purge efficiency by improving a gas valve system by preventing dead volume from occurring are provided. The apparatus includes a reaction chamber in which a substrate is processed to fabricate a semiconductor device; a first processing gas supply pipe supplying a first processing gas into the reaction chamber; a 4-way valve having a first inlet, a second inlet, a first outlet, and a second outlet and installed at the first processing gas supply pipe such that the first inlet and the first outlet are connected to the first processing gas supply pipe; a second processing gas supply pipe connected to the second inlet of the 4-way valve to supply a second processing gas; a bypass connected to the second outlet of the 4-way valve; and a gate valve installed at the bypass.

8 Claims, 12 Drawing Sheets

(51) Int. Cl.
*H01L 21/00* (2006.01)
*H01L 21/02* (2006.01)

(56) References Cited

U.S. PATENT DOCUMENTS

| | | | |
|---|---|---|---|
| 4,911,101 A | 3/1990 | Ballingall et al. | |
| 4,950,621 A | 8/1990 | Irvine et al. | |
| 5,259,233 A | 11/1993 | Brandt | |
| 5,458,086 A * | 10/1995 | Smith et al. | 117/200 |
| 5,866,198 A * | 2/1999 | Sato et al. | 427/124 |
| 5,922,286 A | 7/1999 | Girard et al. | |
| 5,948,169 A | 9/1999 | Wu | |
| 6,063,198 A | 5/2000 | Bang et al. | |
| 6,523,567 B2 * | 2/2003 | Satou et al. | 137/597 |
| 2002/0050322 A1 | 5/2002 | Kunisawa et al. | |
| 2004/0115584 A1 | 6/2004 | Okabe | |
| 2005/0051100 A1 | 3/2005 | Chiang et al. | |
| 2005/0263803 A1 | 12/2005 | Takayanagi | |
| 2006/0130755 A1 | 6/2006 | Clark | |
| 2006/0156980 A1 * | 7/2006 | Won et al. | 118/715 |
| 2006/0231026 A1 | 10/2006 | Lee et al. | |

FOREIGN PATENT DOCUMENTS

| | | |
|---|---|---|
| JP | 1-220821 | 9/1989 |
| JP | 2-21618 | 1/1990 |
| JP | 3-23625 | 1/1991 |
| JP | 3-62921 | 3/1991 |
| JP | 4-78388 | 3/1992 |
| JP | 4-302138 | 10/1992 |
| JP | 4-361531 | 12/1992 |
| JP | 5-47665 | 2/1993 |
| JP | 6-147329 | 5/1994 |
| JP | 61-195043 | 5/1994 |
| JP | 6-163425 | 6/1994 |
| JP | 7-175 | 1/1995 |
| JP | 07058032 | 3/1995 |
| JP | 2002-95955 | 4/2002 |
| JP | 2003168648 | 6/2003 |
| JP | 2005005588 | 1/2005 |
| JP | 2005015904 | 1/2005 |
| KR | 2003-0085917 | 11/2003 |
| KR | 10-2004-0012306 | 2/2004 |
| KR | 10-0452525 | 10/2004 |
| WO | 87/02598 | 5/1987 |

OTHER PUBLICATIONS

"Apparatus Including 4-way Valve for Fabricating Semiconductor Device, Method of Controlling Valve, and Method of Fabricating Semiconductor Device Using the Apparatus" Specification, Drawings and Prosecution History, of U.S. Appl. No. 11/321,491, filed Dec. 29, 2005, by Seok-jun Won, et al., which is stored in the United States Patent and Trademark Office (USPTO) Image File Wrapper (IFW) system.

* cited by examiner

APPARATUS INCLUDING 4-WAY VALVE FOR FABRICATING SEMICONDUCTOR DEVICE, METHOD OF CONTROLLING VALVE, AND METHOD OF FABRICATING SEMICONDUCTOR DEVICE USING THE APPARATUS

CROSS-REFERENCE TO RELATED PATENT APPLICATIONS

This application is a continuation application of U.S. patent application Ser. No. 12/980,633, filed Dec. 29, 2010, which is a divisional application of U.S. patent application Ser. No. 11/321,491, filed on Dec. 29, 2005, which claims the benefit of Korean Patent Application No. 10-2005-0005074, filed on Jan. 19, 2005, and Korean Patent Application No. 10-2005-0076968, filed on Aug. 22, 2005, in the Korean Intellectual Property Office, the contents of which are incorporated herein in their entirety by reference.

BACKGROUND OF THE INVENTION

1. Field of the Invention

The present invention relates to an apparatus for fabricating a semiconductor device, and more particularly, to an apparatus for fabricating a semiconductor device using a 4-way valve with improved purge efficiency by improving a valve system for gas supplied to a reaction chamber, a method of controlling the 4-way valve, and a method of fabricating a semiconductor device using the apparatus.

2. Description of the Related Art

Semiconductor devices are fabricated by repeatedly performing processes such as deposition and patterning of a thin layer on a surface of a substrate, i.e., a wafer. Deposition and patterning of a thin layer is usually performed in a semiconductor process module. A semiconductor process module has a configuration that differs depending on a process to be performed in fabrication of a semiconductor device, but it fundamentally includes a reaction chamber defining a reaction area in which a wafer is loaded and hermetically sealed and a valve system which supplies a gas material to the reaction chamber.

Chemical vapor deposition (CVD) or atomic layer deposition (ALD) are usually used to deposit a thin film on a wafer through a chemical reaction of a gas material. Unlike physical deposition using sputtering, CVD and ALD are similar to each other in that they use chemical reaction between two or more gas materials. However, in CVD, multiple gas materials are simultaneously supplied to a reaction area in a reaction chamber including a wafer so that a reaction product is deposited onto a surface of the wafer from above. In contrast, in ALD, multiple gas materials are sequentially supplied to the reaction area in the reaction chamber so that chemical reaction between the gas materials is limited to only the surface of the wafer.

Despite a disadvantage that the ALD is slow in deposition since the chemical reaction is limited to only the surface of a wafer, ALD is essential to fabrication of a dielectric layer, a diffusion preventing layer, a gate dielectric layer, etc., for a memory capacitor that requires a high-purity and high-uniformity thin film. ALD is advantageous in that deposition and thickness of a thin film whose thickness is decreased with the micronization of a semiconductor device can be controlled precisely.

Due to the characteristics of the ALD, a purge process of removing gas remaining in a reaction chamber before and after a gas material is supplied to the reaction chamber when gas materials are sequentially supplied is mandatory.

FIG. 1 is a schematic diagram illustrating a gas valve system of a conventional ALD apparatus in which ALD is performed. FIG. 2 is an enlarged view of a part of the gas valve system in which dead volume (DV) occurs. FIG. 3 is a cross sectional view of the part shown in FIG. 2, taken along the line AA', in which a 2-way valve is closed. FIG. 4 is a cross sectional view of the part shown in FIG. 2, taken along the line AA', in which the 2-way valve is open.

The conventional ALD apparatus and ALD using the same will be described briefly with reference to FIGS. 1 through 4.

Referring to FIG. 1, a source gas supply source 22, a reactive gas supply source 24, a purge gas supply source 28, a first carrier gas supply source 26, and a second carrier gas supply source 30 supply a source gas S1, a reactive gas S2, a purge gas P2, and carrier gases P1 and P3, e.g., argon gases, respectively, to a reaction chamber 10 via a source gas supply pipe 22a, a reactive gas supply pipe 24a, a purge gas supply pipe 28a, a first carrier gas supply pipe 26a, and a second carrier gas supply pipe 30a, respectively.

A discharge pump 12 is installed at the back of the reaction chamber 10 to control the inner pressure of the reaction chamber 10. A throttle valve 14 is installed between the reaction chamber 10 and the discharge pump 12 to maintain the inner pressure of the reaction chamber 10 constant.

In a source gas supply line, the first carrier gas supply pipe 26a is connected to and extended from the first carrier gas supply source 26 to supply the carrier gas P1. The source gas supply source 22 is connected in parallel through first and second 3-way valves 32 and 34. An on/off valve, i.e., a first 2-way gate valve 42 is installed between the first and second 3-way valves 32 and 34. A bypass 16 is connected to the first carrier gas supply pipe 26a in the back of the second 3-way valve 34 through a third 3-way valve 36. An end of the bypass 16 is connected between the throttle valve 14 and the discharge pump 12 on a discharge pipe 13. An end of the first carrier gas supply pipe 26a is connected to the purge gas supply pipe 28a through a fourth 3-way valve 38.

In a purge gas supply line, the purge gas P2 is supplied from the purge gas supply source 28 to the reaction chamber 10 through the purge gas supply pipe 28a. The fourth 3-way valve 38 is installed at a junction of the purge gas supply pipe 28a and the first carrier gas supply pipe 26a. A second gate valve 44 is installed between the purge gas supply source 28 and the fourth 3-way valve 38.

In a reactive gas supply line, the carrier gas P3 is supplied from the second carrier gas supply source 30 to the reaction chamber 10 through the second carrier gas supply pipe 30a and the reactive gas S2 is supplied from the reactive gas supply source 24 to the reaction chamber 10 through the reactive gas supply pipe 24a and the second carrier gas supply pipe 30a to which the reactive gas supply pipe 24a is connected. A third gate valve 46 is installed between the reaction chamber 10 and the junction of the reactive gas supply pipe 24a and the second carrier gas supply pipe 30a. A fourth gate valve 48 is installed between the junction and the reactive gas supply source 24.

The open/closed state of the inlet and outlet of the third and fourth 3-way valves 36 and 38 will be described with reference to FIGS. 2 through 4. Unlike FIGS. 2 through 4, FIG. 1 just functionally illustrates the inlet and outlet of the third and fourth 3-way valves 36 and 38 according to a flow direction of supplied gas.

The third and fourth 3-way valves 36 and 38 are diaphragm valves. A flow of a gas material according to on/off of the third 3-way valve 36 will be described. The third 3-way valve 36 installed at the junction of the first carrier gas supply pipe 26a and the bypass 16 includes a first vertical via hole 36h1, which is vertically connected to the first carrier gas supply pipe 26a penetrating straight through a body 36c, and a second vertical via hole 36h2 which is vertically connected to an end of the bypass 16. A diaphragm 36e moved up and down by a pressure is installed above a surface of the body 36c through which the first and second vertical via holes 36h1 and 36h2 are exposed within a housing 36d to define a predetermined space.

When the third 3-way valve 36 is turned off, that is, when the diaphragm 36e moves downward and closely contacts the surface of the body 36c to close the first and second vertical via holes 36h1 and 36h2, as shown in FIG. 3, the first carrier gas supply pipe 26a is open and enables the first carrier gas P1 or the source gas S2 to flow to the fourth 3-way valve 38, but a gas flow to the bypass 16 is blocked.

When the third 3-way valve 36 is turned on, that is, when the diaphragm 36e moves upward and is separated from the surface of the body 36c to open the first and second vertical via holes 36h1 and 36h2, as shown in FIG. 4, the first carrier gas supply pipe 26a is open and enables the first carrier gas P1 or the source gas S2 to flow to the fourth 3-way valve 38, and simultaneously, a gas material flowing out through the first vertical via hole 36h1 passes through a space between the surface of the body 36c and the diaphragm 36e and flows into the bypass 16 through the second vertical via hole 36h2.

Referring to FIGS. 1 through 4, regardless of the on/off state of the third 3-way valve 36, a second outlet 36b of the third 3-way valve 36 is open. Accordingly, whether the first carrier gas P1 or the source gas S1 is supplied to the reaction chamber 10 through the third and fourth 3-way valves 36 and 38 depends on whether an inlet 38b of the fourth 3-way valve 38 is open or closed. As a result, when the inlet 38b of the fourth 3-way valve 38 is closed, the first carrier gas P1 or the source gas S1 does not flow to the fourth 3-way valve 38 but flows into the bypass 16 even when the second outlet 36b of the third 3-way valve 36 is open.

A process of depositing a reaction product S1+S2 to form a thin film on a surface of a substrate using ALD using the source gas S1 and the reactive gas S2 will be described below.

In a source gas pulsing stage, the source gas S1 is supplied to the reaction chamber 10 loaded with a wafer, i.e., the substrate (not shown) so that a source gas material is attached to a surface of the substrate. Here, the first gate valve 42 is turned off to be closed; a first outlet 32a of the first 3-way valve 32 is open; an inlet 34a and an outlet 34b of the second 3-way valve 34 are open; a first outlet 36a of the third 3-way valve 36 toward the bypass 16 is closed; the second outlet 36b of the third 3-way valve 36 is open; and the inlet 38b and an outlet 38a of the fourth 3-way valve 38 are open. Accordingly, the source gas S1 is supplied to the reaction chamber 10 together with the first carrier gas P1. Meanwhile, the purge gas P2 is continuously supplied to the reaction chamber 10 and the second carrier gas P3 is also supplied to the reaction chamber 10 in a state where the fourth gate valve 48 is closed. Generally, in a 3-way valve, when one flow path is closed, another flow path is open.

Thereafter, in a source gas purging stage, source gas residues that are not attached to the surface of the substrate are removed from the reaction chamber 10. Here, the first gate valve 42 is open; the first outlet 32a of the first 3-way valve 32 is closed (when a second outlet 32b of the first 3-way valve 32 is open according to the characteristic of a 3-way valve); the inlet 34a of the second 3-way valve 34 is closed (when the outlet 34b of the second 3-way valve 34 is open); the first outlet 36a of the third 3-way valve 36 toward the bypass 16 is open (when a second outlet 36b of the third 3-way valve 36 is open); and the inlet 38b of the fourth 3-way valve 38 is closed (when the outlet 38a of the fourth 3-way valve 38 is open). Accordingly, the residues of the source gas S1 within the supply pipes flow to the bypass 16 together with the first carrier gas P1 and the residues of the source gas S1 within the reaction chamber 10 purged by the purge gas P2 continuously supplied to the reaction chamber 10. Here, the second carrier gas P3 is also supplied to the reaction chamber 10 in a state where the fourth gate valve 48 is closed.

Subsequently, in a reactive gas pulsing stage, the reactive gas S2 is supplied into the reaction chamber 10 in a state where the source gas S1 has been deposited on the surface of the substrate so that the source gas S1 reacts with part of the reactive gas S2, thereby forming a reaction product on the surface of the substrate. Here, a supply line for the first carrier gas P1 and the purge gas P2 is the same as that in the source gas purging stage, with the exception that the fourth gate valve 48 is open so that the reactive gas S2 is supplied into the reaction chamber 10 together with the second carrier gas P3. Meanwhile, the purge gas P2 is continuously supplied into the reaction chamber 10.

Subsequently, in a reactive gas purging stage, the residues of the reactive gas S2 other than the reaction product of the source gas S1 and the reactive gas S2 deposited on the surface of the substrate are removed from the reaction chamber 10. Here, a supply line for the first carrier gas P1 and the purge gas P2 is the same as that in the source gas purging stage. The fourth gate valve 48 is closed and only the second carrier gas P3 is supplied to the reaction chamber 10.

As described above, when one cycle of the source gas pulsing stage, the source gas purging stage, the reactive gas pulsing stage, and the reactive gas purging stage is performed, the reaction product of the source gas 51 and the reactive gas S2 is deposited to be very thin on the surface of the substrate. Several or several thousands of cycles may be performed to form a desired thin layer on the surface of the substrate.

However, the conventional ALD apparatus has a problem in that dead volume (DV), in which purging is not performed and a source gas material is stagnant between valves, occurs. In FIG. 2, a hatched portion between the third 3-way valve 36 and the fourth 3-way valve 38 corresponds to a DV portion. In detail, when source gas purging starts after source gas pulsing in which the source gas S1 is supplied to the reaction chamber 10 through the third 3-way valve 36 and the fourth 3-way valve 38, as described above, supply of the source gas S1 is interrupted and the first carrier gas P1 is discharged through the bypass 16. Here, the source gas S1 remains in the portion of the first carrier gas supply pipe 26a corresponding to the DV portion between the third 3-way valve 36 and the fourth 3-way valve 38. The remaining source gas is still stagnant in the first carrier gas supply pipe 26a during the succeeding reactive gas pulsing and purging stages. Only after a single ALD cycle is completed, the remaining source gas in the DV portion flows into the reaction chamber 10 when the outlet 38b of the fourth 3-way valve 38 is open in the source gas pulsing stage in a subsequent cycle.

When a gas material such as a source gas is stagnant in a DV portion for a long time, degradation occurs and an additional dummy process of removing the remaining source gas is required. In particular, when a dielectric layer or a complex layer, which includes multiple layers made of different materials, is formed using the conventional ALD apparatus, different source gas materials may react with each other in the DV portion, thereby generating unnecessary particles. As a result, a thin film formed through the ALD may have defects or low uniformity.

The source gas material remaining in the DV portion may be slowly diffused and discharged, but it is not completely removed even after several minutes. Taking into account that an ALD cycle takes several seconds, it is very difficult to perform ALD using different kinds of source gas without purging and removing the source gas remaining in the DV portion.

SUMMARY OF THE INVENTION

The present invention provides an apparatus for fabricating a semiconductor device, by which purge efficiency is increased by preventing dead volume from occurring in a gas valve system.

The present invention also provides a method of controlling a valve in the apparatus for fabricating a semiconductor device, by which purge efficiency is increased by preventing dead volume from occurring in a gas valve system.

The present invention also provides a method of fabricating a semiconductor device, by which purge efficiency is increased by preventing dead volume from occurring in a gas valve system of the apparatus.

According to a first aspect of the present invention, there is provided an apparatus for fabricating a semiconductor device. The apparatus includes a reaction chamber in which a substrate is processed to fabricate a semiconductor device; a first processing gas supply pipe supplying a first processing gas into the reaction chamber; a 4-way valve having a first inlet, a second inlet, a first outlet, and a second outlet and installed at the first processing gas supply pipe such that the first inlet and the first outlet are connected to the first processing gas supply pipe; a second processing gas supply pipe connected to the second inlet of the 4-way valve to supply a second processing gas; a bypass connected to the second outlet of the 4-way valve; and a gate valve installed at the bypass.

According to a second aspect of the present invention, there is provided an apparatus for fabricating a semiconductor device. The apparatus includes a reaction chamber in which a substrate is processed to fabricate a semiconductor device; a purge gas supply pipe connected to the reaction chamber to supply a purge gas to the reaction chamber; a 4-way valve having a first inlet, a second inlet, a first outlet, and a second outlet and installed at the purge gas supply pipe such that the first inlet and the first outlet are connected to the purge gas supply pipe; a source gas supply pipe connected to the second inlet of the 4-way valve to supply a source gas to the reaction chamber; a first carrier gas supply pipe connected to the source gas supply pipe; a reactive gas supply pipe connected to the reaction chamber to supply a reactive gas to the reaction chamber; a second carrier gas supply pipe connected to the reactive gas supply pipe; a discharge pipe connected to the reaction chamber to discharge gas from the reaction chamber; a discharge pump installed at the discharge pipe; a bypass connected to the second outlet of the 4-way valve and to the discharge pipe in front of the discharge pump; and a gate valve installed at the bypass.

According to a third aspect of the present invention, there is provided a method of controlling a valve of the apparatus according to the first aspect of the present invention. The method includes closing the gate valve installed at the bypass and opening the 4-way valve while the second processing gas is supplied to the reaction chamber, and opening the gate valve and closing the 4-way valve while supply of the second processing gas to the reaction chamber is interrupted.

According to a fourth aspect of the present invention, there is provided a method of controlling a valve of the apparatus according to the second aspect of the present invention. The method includes closing the gate valve installed at the bypass and opening the 4-way valve while the source gas is supplied to the reaction chamber, and opening the gate valve and closing the 4-way valve while supply of the source gas to the reaction chamber is interrupted.

According to a fifth aspect of the present invention, there is provided a method of fabricating a semiconductor device using the apparatus according to the second aspect of the present invention. The method includes loading the substrate into the reaction chamber, attaching a source gas material to the substrate by supplying the source gas to the reaction chamber, purging a source gas material that is not attached to the substrate by supplying the purge gas to the reaction chamber, forming a first reaction product layer on the substrate by supplying the reactive gas to the reaction chamber to allow the reactive gas to react with the source gas material attached to the substrate, and purging the reactive gas that has not reacted with the source gas material by supplying the purge gas to the reaction chamber.

According to a sixth aspect of the present invention, there is provided an apparatus for fabricating a semiconductor device. The apparatus includes a reaction chamber in which a substrate is processed to fabricate a semiconductor device; a purge gas supply pipe connected to the reaction chamber to supply a purge gas to the reaction chamber; a first 4-way valve having a first inlet, a second inlet, a first outlet, and a second outlet and installed at the purge gas supply pipe such that the first inlet and the first outlet are connected to the purge gas supply pipe; a second 4-way valve having a first inlet, a second inlet, a first outlet, and a second outlet and installed at the purge gas supply pipe such that the first inlet and the first outlet are connected to the purge gas supply pipe and that the second 4-way valve is connected to the first 4-way valve in series; a first source gas supply pipe and a second source gas supply pipe respectively connected to the second inlets of the respective first and second 4-way valves to supply a source gas to the reaction chamber; first carrier gas supply pipes respectively connected to the first and second source gas supply pipes; a reactive gas supply pipe connected to the reaction chamber to supply a reactive gas to the reaction chamber; a second carrier gas supply pipe connected to the reactive gas supply pipe; a discharge pipe connected to the reaction chamber to discharge gas from the reaction chamber; a discharge pump installed at the discharge pipe; a bypass comprising two branches respectively connected to the second outlets of the respective first and second 4-way valves and an end connected to the discharge pipe in front of the discharge pump; and gate valves installed at the two branches, respectively, of the bypass.

According to a seventh aspect of the present invention, there is provided a method of fabricating a semiconductor device using the apparatus according to the sixth aspect of the present invention. The method includes loading the substrate into the reaction chamber, attaching a source gas material to the substrate by selectively supplying one of the first and second source gases to the reaction chamber, purging a source gas material that is not attached to the substrate by supplying the purge gas to the reaction chamber, forming a first reaction product layer on the substrate by supplying the reactive gas to the reaction chamber to allow the reactive gas to react with the source gas material attached to the substrate, and purging the reactive gas that has not reacted with the source gas material by supplying the purge gas to the reaction chamber.

According to the present invention, a 4-way valve is formed at a junction of a purge gas supply pipe and a source gas supply pipe and a bypass is connected to one outlet of the 4-way valve so that dead volume caused by the stagnation of a source gas is prevented. Even when the dead volume occurs, a gas material stagnant in a dead volume portion is not supplied to a reaction chamber but is discharged through the bypass. Accordingly, purge efficiency is increased and reliable semiconductor devices can be fabricated.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

The present invention can be applied to any equipment that fundamentally supplies a gas material into a reaction chamber and performs semiconductor fabrication processes in the reaction chamber using the gas material. Accordingly, the present invention can be widely used in deposition equipment such as chemical vapor deposition (CVD) or atomic layer deposition (ALD) equipment and etching equipment. The following exemplary embodiments of the present invention are described in connection with ALD, but the invention is applicable to other processes.

Figure 1:
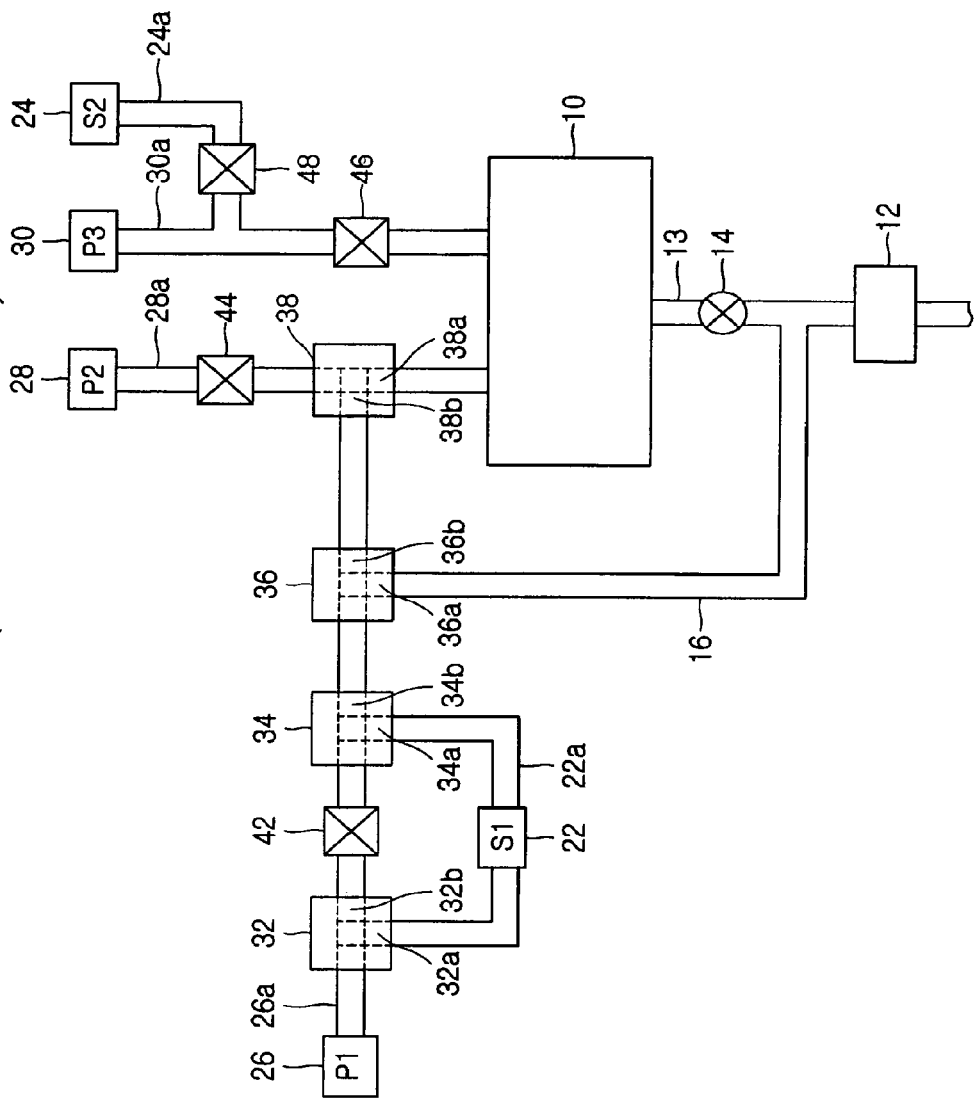
FIG. 1 is a schematic diagram illustrating a gas valve system of a conventional apparatus for fabricating a semiconductor device.
Figure 2:
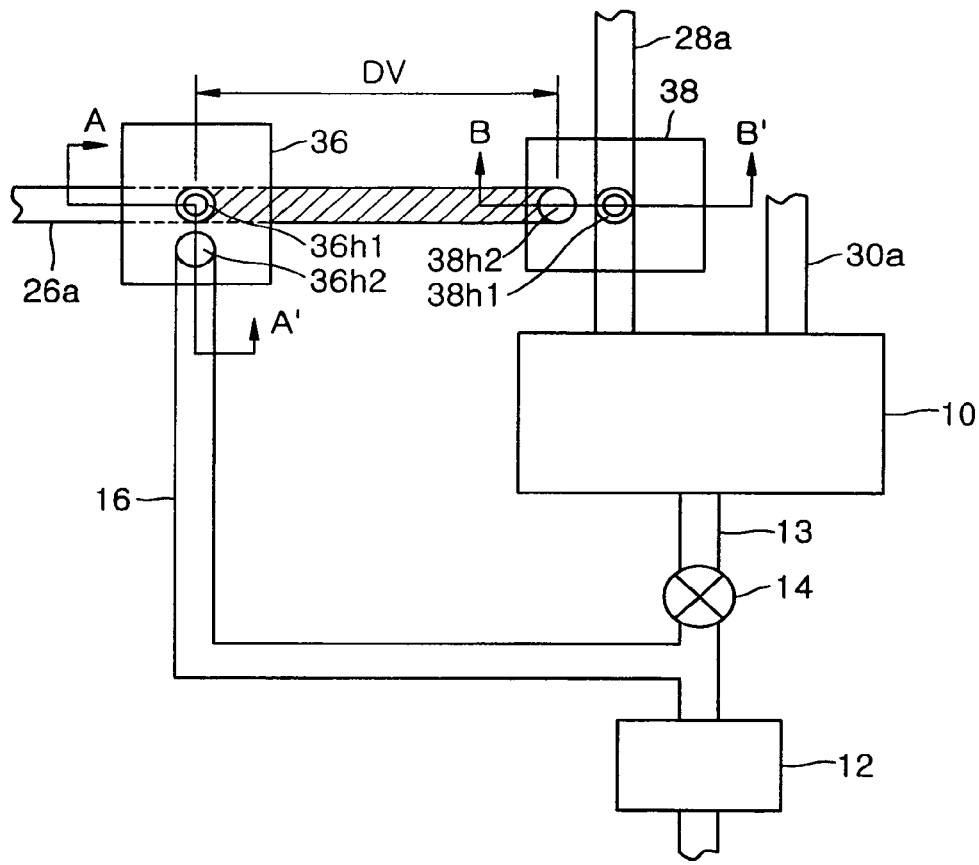
FIG. 2 is an enlarged view of a part of the gas valve system in which dead volume (DV) occurs.
Figure 3:
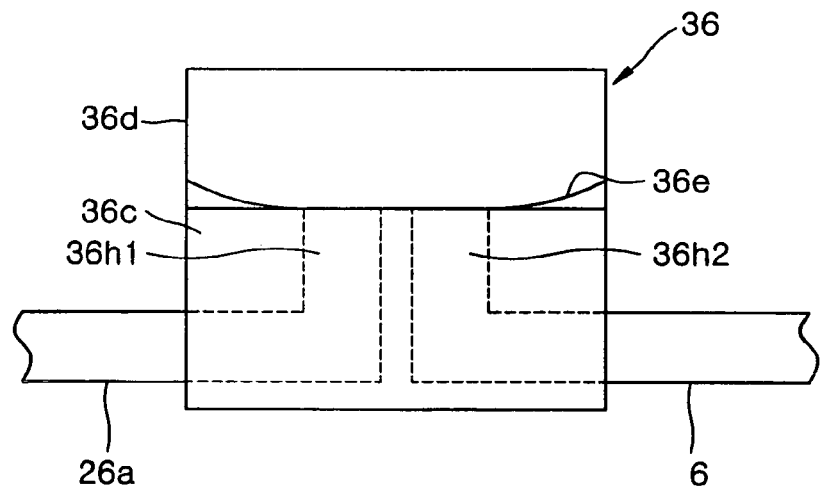
FIG. 3 is a cross sectional view of the part shown in FIG. 2, taken along the line AA', in which a 2-way valve is closed.
Figure 4:
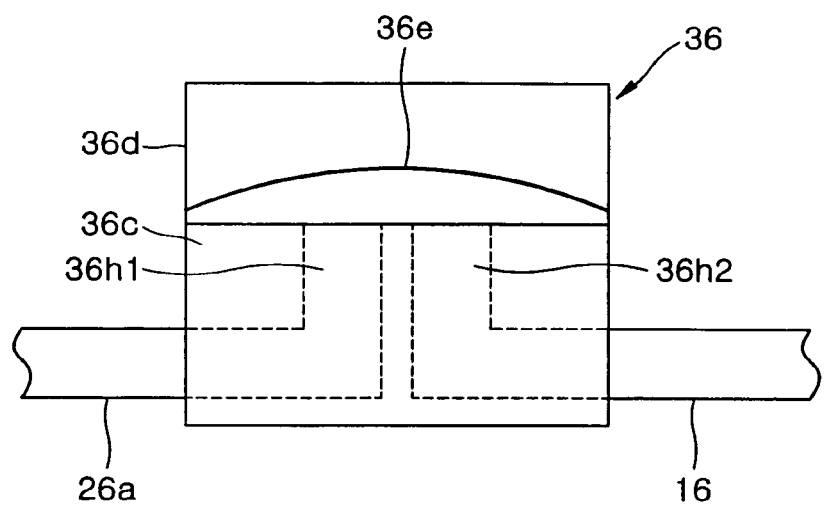
FIG. 4 is a cross sectional view of the part shown in FIG. 2, taken along the line AA', in which the 2-way valve is open.
Figure 5:
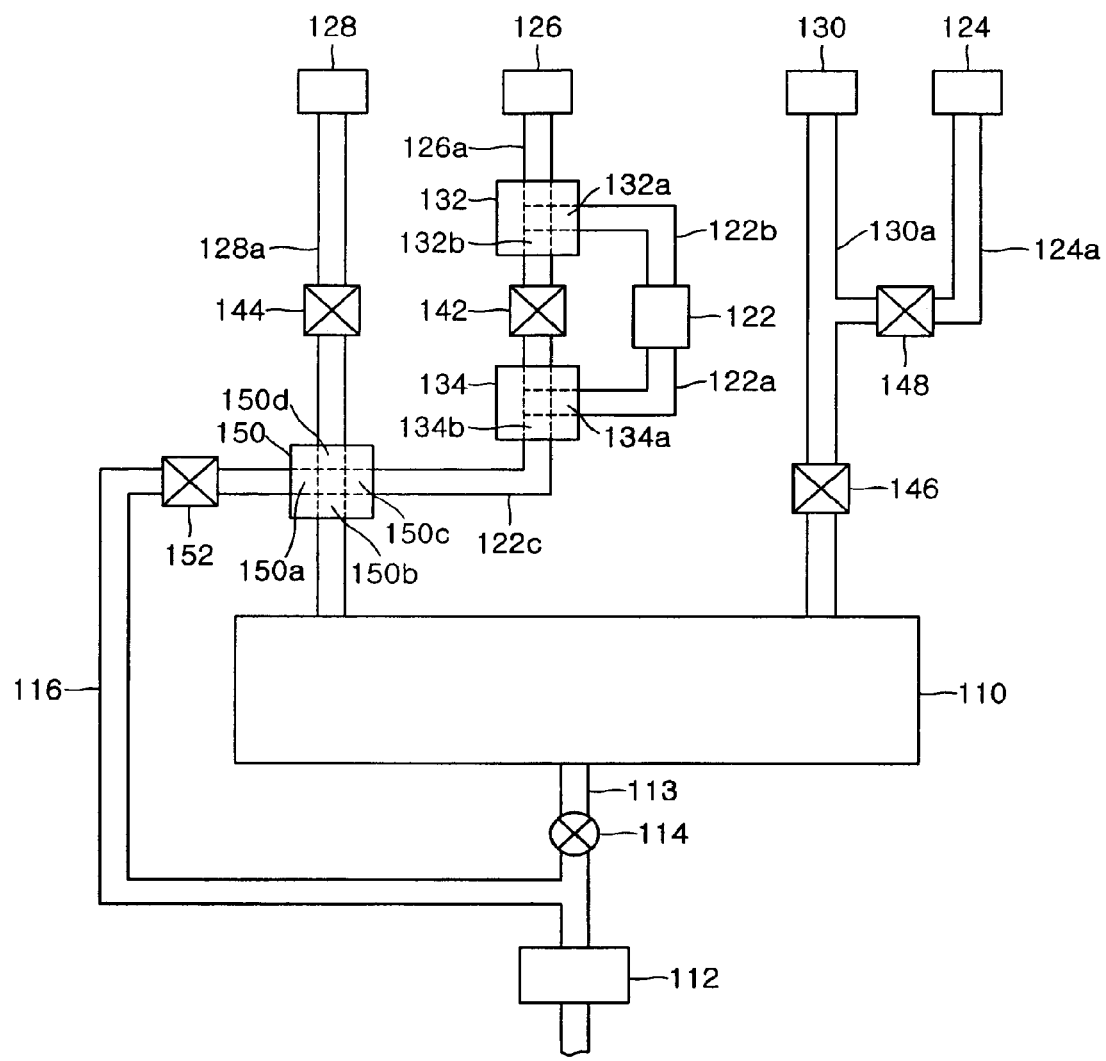
FIG. 5 is a schematic diagram illustrating an apparatus for fabricating a semiconductor device according to a first embodiment of the present invention.
Figure 6:
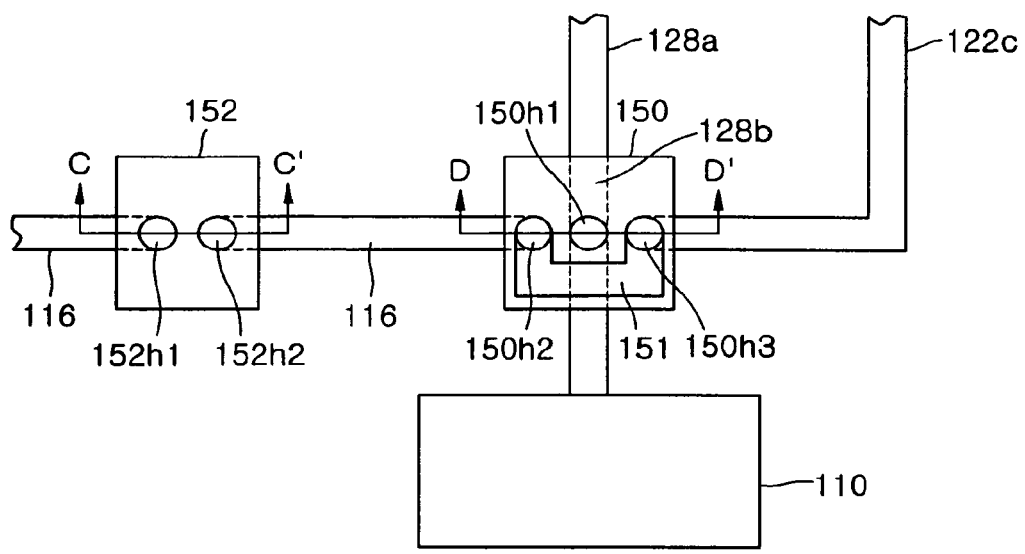
FIG. 6 is an enlarged view of an essential part of the apparatus illustrated in FIG. 5.
Figure 7:
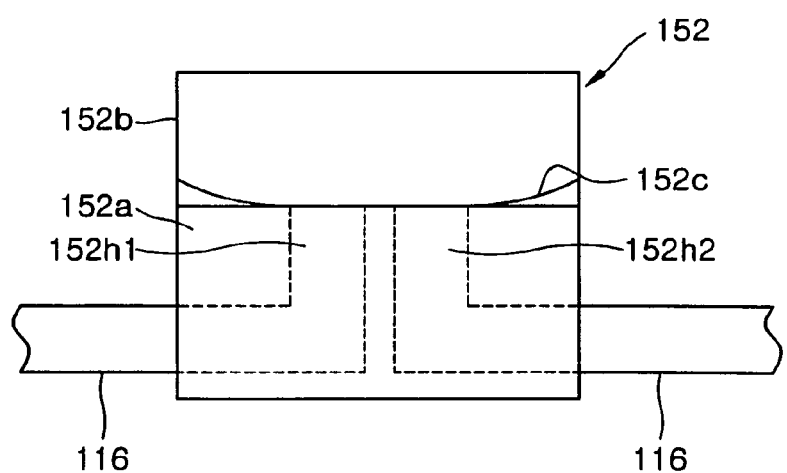
FIG. 7 is a cross sectional view of the part shown in FIG. 6, taken along the line CC', in which a 2-way valve is closed.
Figure 8:
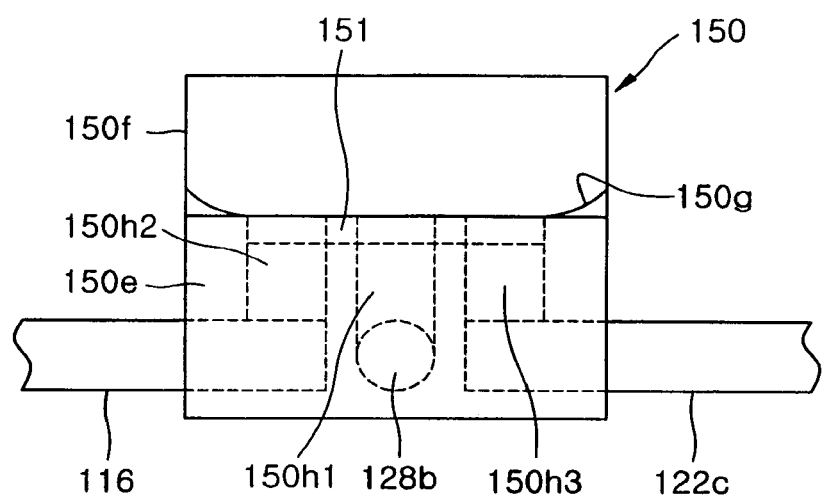
FIG. 8 is a cross sectional view of the part shown in FIG. 6, taken along the line DD', in which a 4-way valve is closed.

FIG. 5 is a schematic diagram illustrating an apparatus for fabricating a semiconductor device according to a first embodiment of the present invention. FIG. 6 is an enlarged view of a part of the apparatus illustrated in FIG. 5. FIG. 7 is a cross sectional view of the part shown in FIG. 6, taken along the line CC', in which a 2-way valve is closed. FIG. 8 is a cross sectional view of the part shown in FIG. 6, taken along the line DD', in which a 4-way valve is closed.

The apparatus for fabricating a semiconductor device, a valve control method, and a method of fabricating a semiconductor device using the apparatus, according to the first embodiment of the present invention will be described in detail with reference to FIGS. 5 through 8.

Referring to FIG. 5, a source gas supply source 122, a reactive gas supply source 124, a purge gas supply source 128, a first carrier gas supply source 126, and a second carrier gas supply source 130 supply a source gas, a reactive gas, a purge gas, and first and second carrier gases, respectively, to a reaction chamber 110 via a source gas supply pipe 122a, a reactive gas supply pipe 124a, a purge gas supply pipe 128a, a first carrier gas supply pipe 126a, and a second carrier gas supply pipe 130a, respectively. Here, the source gas and the reactive gas used to form materials using ALD, and particularly, oxide materials such as $SiO_2$, $Al_2O_3$, $Ta_2O_5$, and $HfO_2$ and nitride materials such as SiN, TiN, and TaN, may be appropriately selected. For example, to form alumina ($Al_2O_3$) using ALD, trimethylaluminum (TMA) may be used as the source gas and $H_2O$ may be used as the reactive gas. According to a material to be formed, hydrogen plasma may be used as the reactive gas or oxygen plasma instead of $H_2O$ may be used as a source of oxygen. Argon gases are used as the purge gas and the first and second carrier gases in this embodiment, but various gases may be used.

In the drawings and the following descriptions, fundamentally, a pipe section through which the source gas is supplied from the source gas supply source 122 to the reaction chamber 110 is referred to as the source gas supply pipe 122a; a pipe section through which the reactive gas is supplied from the reactive gas supply source 124 to the reaction chamber 110 is referred to as the reactive gas supply pipe 124a; a pipe section through which the purge gas is supplied from the purge gas supply source 128 to the reaction chamber 110 is referred to as the purge gas supply pipe 128a; a pipe section through which the first carrier gas is supplied from the first carrier gas supply source 126 to the reaction chamber 110 is referred to as the first carrier gas supply pipe 126a; and a pipe section through which the second carrier gas is supplied from the second carrier gas supply source 130 to the reaction chamber 110 is referred to as the second carrier gas supply pipe 130a. However, since two or more gases may be supplied through a single pipe, the pipe may have two or more reference names in the following description.

In addition, although the reaction chamber 110 is not specifically illustrated, it is designed such that a substrate, i.e., a wafer, used to fabricate semiconductor devices is loaded and landed therein. The reaction chamber 110 may be a single wafer type or batch type reaction chamber and may be combined with a device for inducing plasma within the reaction chamber 110. A discharge pump 112 is installed in the back of the reaction chamber 110 to control an inner pressure of the reaction chamber 110. A throttle valve 114 is installed between the reaction chamber 110 and the discharge pump 112 to maintain the inner pressure of the reaction chamber 110 constant.

In a source gas supply line, the first carrier gas supply pipe 126a is connected to the first carrier gas supply source 126 to supply the carrier gas. The source gas supply source 122 is connected to the first carrier gas supply pipe 126a in parallel through first and second 3-way valves 132 and 134. An on/off valve, i.e., a first gate valve 142 is installed between the first and second 3-way valves 132 and 134. A source gas supply pipe 122c in the back of the second 3-way valve 134 is connected with the purge gas supply pipe 128a through first and second inlets 150c and 150d of a 4-way valve 150. In FIG. 5, the 4-way valve 150 is illustrated functionally and includes the first and second inlets 150c and 150d through which a gas material flows in and first and second outlets 150a and 150b through which a gas material flows out. The second outlet 150b of the 4-way valve 150 is connected to the reaction chamber 110 and the first outlet 150a of the 4-way valve 150 is connected to a bypass 116. Another end of the bypass 116 is connected to a discharge pipe 113 between the throttle valve 114 and the discharge pump 112. A fifth gate valve 152 is installed at the bypass 116. According to the on/off state of the first gate valve 142, the first carrier gas or the source gas is supplied to the reaction chamber 110 or the bypass 116 via the 4-way valve 150.

In a purge gas supply line, the purge gas is supplied from the purge gas supply source 128 to the reaction chamber 110 through the purge gas supply pipe 128a. The 4-way valve 150 is installed at a junction of the purge gas supply pipe 128a and the first carrier gas supply pipe 126a. A second gate valve 144 is installed between the purge gas supply source 128 and the 4-way valve 150.

In a reactive gas supply line, the second carrier gas is supplied from the second carrier gas supply source 130 to the reaction chamber 110 through the second carrier gas supply pipe 130a, and the reactive gas is supplied from the reactive gas supply source 124 to the reaction chamber 110 through the reactive gas supply pipe 124a and the second carrier gas supply pipe 130a to which the reactive gas supply pipe 124a is connected. A third gate valve 146 is installed between the reaction chamber 110 and the junction of the reactive gas supply pipe 124a and the second carrier gas supply pipe 130a. A fourth gate valve 148 is installed between the junction and the reactive gas supply source 124.

The structure of the 4-way valve 150 and the fifth gate valve 152 and the open/closed states of their inlets and outlets will be described with reference to FIGS. 5 through 8. FIG. 5 functionally illustrates the inlets and outlets of the 4-way valve 150 and the fifth gate valve 152 according to a flow direction of supplied gas. FIGS. 6 through 8 specifically illustrate the 4-way valve 150 and the fifth gate valve 152.

The 4-way valve 150 and the fifth gate valve 152 are diaphragm valves in the embodiment of the present invention, but the present invention is not restricted thereto. A flow of a gas material according to on/off states of the 4-way valve 150 and the fifth gate valve 152 will be described.

As illustrated in FIG. 7, the fifth gate valve 152 installed at the bypass 116 does not allow the bypass 116 to directly penetrate the fifth gate valve 152 in a straight line but includes first and second vertical via holes 152h1 and 152h2 to be vertically connected to the bypass 116 side by side. The first and second vertical via holes 152h1 and 152h2 extend to a top surface of a body 152a. A diaphragm 152c moved up and down by pressure is installed above the top surface of the body 152a through which the first and second vertical via holes 152h1 and 152h2 are exposed within a housing 152b to define a predetermined space.

When the fifth gate valve 152 is turned off, that is, when the diaphragm 152c moves downward and closely contacts the surface of the body 152a to close the first and second vertical via holes 152h1 and 152h2, as shown in FIG. 7, a flow of a gas material through the bypass 116 is blocked. When the fifth gate valve 152 is turned on, that is, when the diaphragm 152c moves upward and is separated from the surface of the body 152a to open the first and second vertical via holes 152h1 and 152h2, a gas material can flow through the bypass 116. That is, a gas material flowing into the bypass 116 via the first outlet 150a of the 4-way valve 150 flows out through the second vertical via hole 152h2, passes through a space between the top surface of the body 152a and the diaphragm 152c, and flows into the bypass 116 again via the first vertical via hole 152h1.

As shown in FIGS. 5, 6, and 8, the 4-way valve 150 includes a first horizontal via hole 128b connecting the second inlet 150d and the second outlet 150b, a first vertical via hole 150h1 extending from the middle of the first horizontal via hole 128b to a top surface of a body 150e, a third vertical via hole 150h3 communicating with the first inlet 150c connected with the source gas supply pipe 122c, a second vertical via hole 150h2 communicating with the first outlet 150a connected with the bypass 116, and a second horizontal via hole 151 connecting the upper portion of the second vertical via hole 150h2 and the upper portion of the third vertical via hole 150h3. A housing 150f is formed above the body 150e of the 4-way valve 150 to define a predetermined space. A diaphragm 150g which can be moved up and down is installed within the space defined by the housing 150f.

As illustrated in FIG. 8, when the 4-way valve 150 is turned off, that is, when the diaphragm 150g moves down and closely contacts the top surface of the body 150e to close the upper ends of the first through third vertical via holes 150h1 through 150h3, the purge gas is supplied to the reaction chamber 110 via the first horizontal via hole 128b, and the source gas or the first carrier gas flowing in the source gas supply pipe 122c flows into the bypass 116 via the third vertical via hole 150h3, the second horizontal via hole 151, and the second vertical via hole 150h2. When the 4-way valve 150 is turned on, that is, when the diaphragm 150g moves up and is separated from the top surface of the body 150e to open the upper ends of the first through third vertical via holes 150h1 through 150h3, the purge gas flows into the reaction chamber 110 via the first horizontal via hole 128b, and the source gas or the first carrier gas flows into the bypass 116 through the third vertical via hole 150h3, the second horizontal via hole 151 or a space between the top surface of the body 150a and the diaphragm 150g, and the second vertical via hole 150h2 and into the reaction chamber 110 via the through the third vertical via hole 150h3, the space between the top surface of the body 150a and the diaphragm 150g, and the first vertical via hole 150h1. Here, when fifth gate valve 152 is turned off, the first carrier gas or the source gas flows only to the reaction chamber 110 through the third vertical via hole 150h3, the space between the top surface of the body 150a and the diaphragm 150g, and the first vertical via hole 150h1.

Selection between the source gas and the first carrier gas and selection between the reactive gas and the second carrier gas will be described below in connection with description of an ALD process.

The following describes in detail a process of depositing a reaction product of the source gas and the reactive gas on a surface of a substrate using ALD. In performing the ALD process, a sequential set of a source gas pulsing stage, a source gas purging stage, a reactive gas pulsing stage, and a reactive gas purging stage is defined as one cycle, and the cycles are repeated until a thin layer having a desired thickness is formed.

In the source gas pulsing stage, the source gas is supplied to the reaction chamber 110 loaded with a wafer, i.e., the substrate (not shown), so that a source gas material is attached to the surface of the substrate. Here, the first gate valve 142 is turned off to be closed, a first outlet 132a of the first 3-way valve 132 is open, and a first inlet 134a and an outlet 134b of the second 3-way valve 134 are open, so that the first carrier gas and the source gas are simultaneously supplied. In addition, the fifth gate valve 152 installed at the bypass 116 is turned off while the 4-way valve 150 is turned on, so that a gas flow to the bypass 116 is blocked and a gas flow is introduced to the reaction chamber 110. As a result, the source gas is supplied to the reaction chamber 110 together with the first carrier gas. In one embodiment, at the same time, the purge gas is continuously supplied to the reaction chamber 110. The second carrier gas may be supplied to the reaction chamber 110 by closing the fourth gate valve 148 and opening the third gate valve 146.

Subsequently, in the source gas purging stage, source gas residues that are not attached to the surface of the substrate are removed from the reaction chamber 110. In this purging stage, the first gate valve 142 is open; the first outlet 132a of the first 3-way valve 132 is closed while a second outlet 132b of the first 3-way valve 132 is open; and the first inlet 134a of the second 3-way valve 134 is closed while the outlet 134b of the second 3-way valve 134 is open, so that the supply of the reactive gas is interrupted and the first carrier gas is allowed to flow. In addition, the fifth gate valve 152 installed at the bypass 116 is turned on while the 4-way valve 150 is turned off, so that the first carrier gas is discharged through the bypass 116. Accordingly, the source gas remaining between the second 3-way valve 134 and the 4-way valve 150 and between the 4-way valve 150 and the fifth gate valve 152 does not flow into the reaction chamber 110 but is discharged through the bypass 116 together with the first carrier. The source gas remaining in the reaction chamber 110 without being deposited is purged by the purge gas continuously supplied to the reaction chamber 110. Here, the second carrier gas may be continuously supplied to the reaction chamber 110 in a state where the fourth gate valve 148 is closed.

Subsequently, in the reactive gas pulsing stage, the reactive gas is supplied into the reaction chamber 110 in a state where the source gas has been deposited on the surface of the substrate so that the source gas reacts with part of the reactive gas, thereby forming a reaction product on the surface of the substrate. Here, similarly to the source gas purging stage, the first carrier gas is discharged through the bypass 116 and the purge gas is continuously supplied to the reaction chamber 110. However, in the reactive gas pulsing stage, the fourth gate valve 148 installed at the reactive gas supply line and the third gate valve 146 are open so that the reactive gas is supplied to the reaction chamber 110 together with the second carrier gas.

Subsequently, in the reactive gas purging stage, the residues of the reactive gas other than the reaction product of the source gas and the reactive gas deposited on the surface of the substrate are removed from the reaction chamber 110. Here, similarly to the source gas purging stage, the first carrier gas is discharged through the bypass 116 and the purge gas is continuously supplied to the reaction chamber 110. However, in the reactive gas purging stage, the fourth gate valve 148 at the reactive gas supply line is closed to interrupt the supply of the reactive gas. As a result, only the second carrier gas is supplied to the reaction chamber 110.

As described above, when a cycle of the source gas pulsing stage, the source gas purging stage, the reactive gas pulsing stage, and the reactive gas purging stage is performed, the reaction product of the source gas and the reactive gas is deposited to be very thin on the surface of the substrate. Several or several thousands of cycles may be performed to form a desired thin layer on the surface of the substrate. In the above-described embodiment of the present invention, a single layer is formed on the substrate through the ALD process using a single source gas. For example, when the source gas, the reactive gas, and the reaction product of the source gas and the reactive gas are represented by "A", "B", and "AB", respectively, a layer deposited on the substrate according to the first embodiment of the present invention may be represented by "AB/AB/AB/AB . . . AB/AB".

Figure 9:
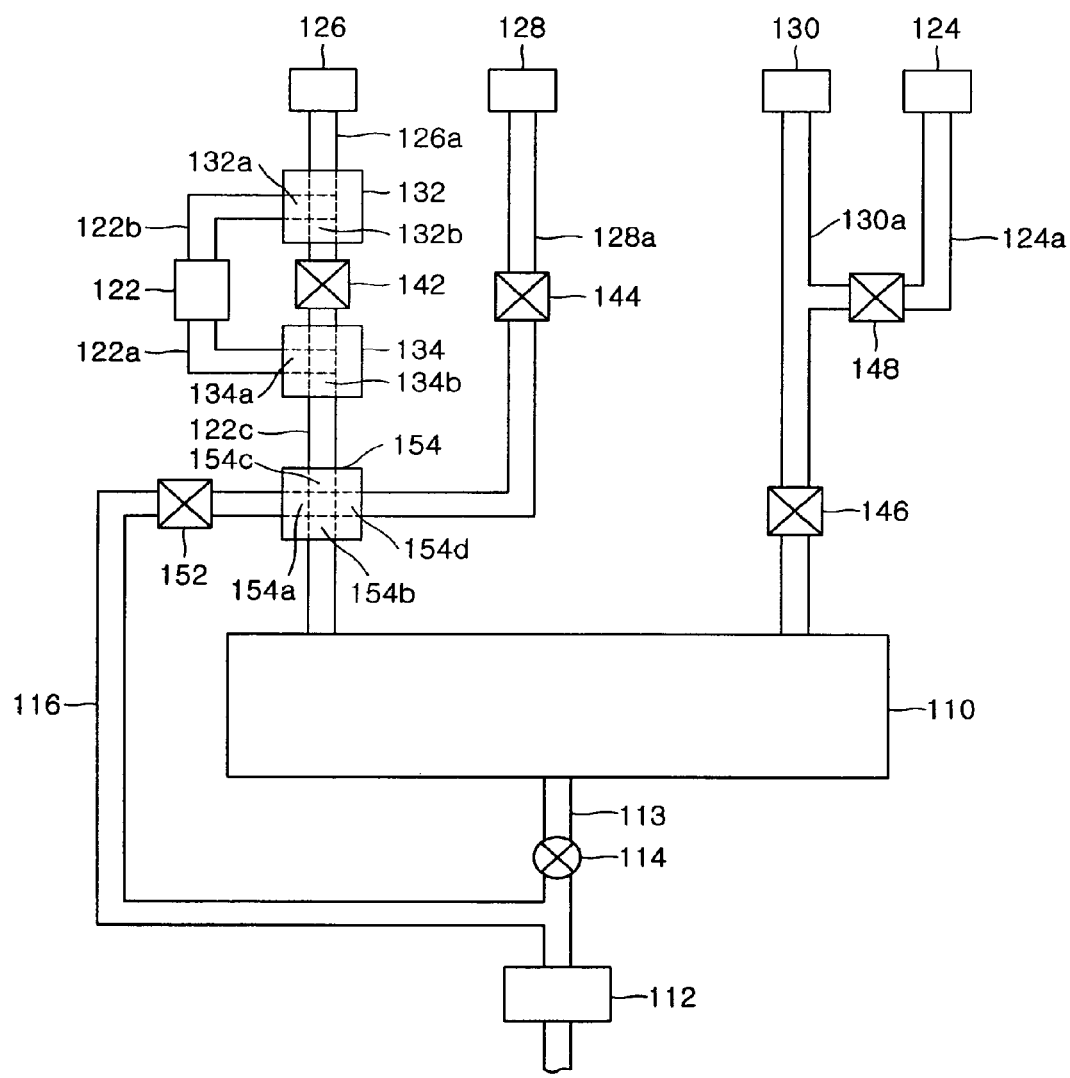
FIG. 9 is a schematic diagram illustrating an apparatus for fabricating a semiconductor device according to a second embodiment of the present invention.
Figure 10:
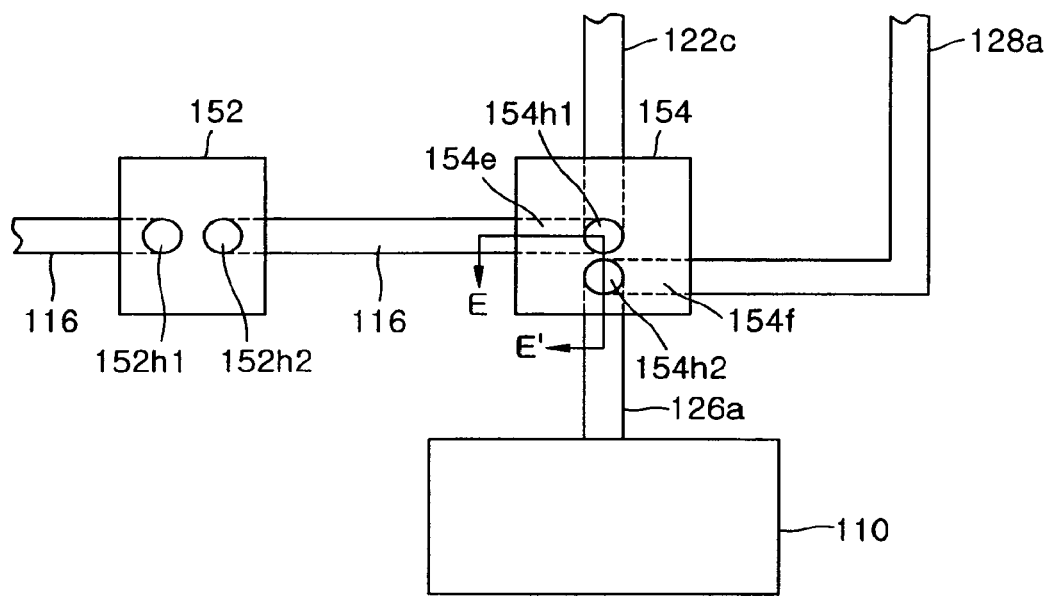
FIG. 10 is an enlarged view of an essential part of the apparatus illustrated in FIG. 9.
Figure 11:
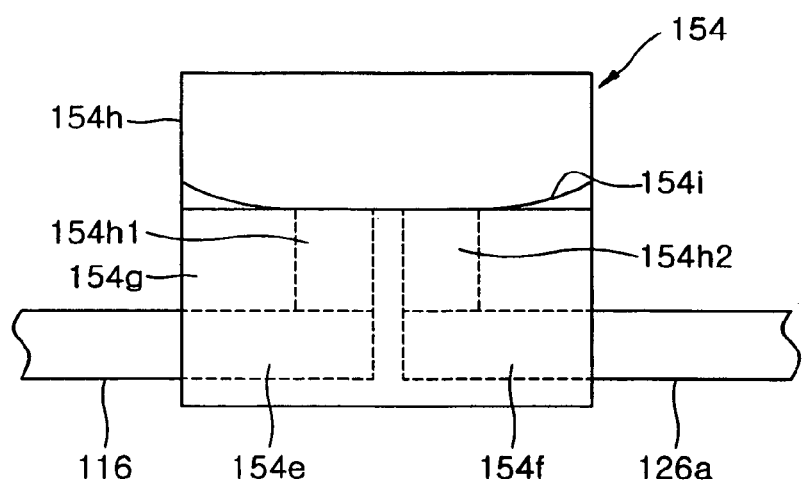
FIG. 11 is a cross sectional view of the part shown in FIG. 9, taken along the line EE', in which a 4-way valve is closed.

FIG. 9 is a schematic diagram illustrating an apparatus for fabricating a semiconductor device according to a second embodiment of the present invention. FIG. 10 is an enlarged view of a part of the apparatus illustrated in FIG. 9. FIG. 11 is a cross sectional view of the part shown in FIG. 9, taken along the line EE', in which a 4-way valve is closed. The second embodiment is the same as the first embodiment, with the exception that the structure of the 4-way valve 154 and the disposition of the purge gas supply line and the source gas supply line are different from those in the first embodiment. The differences will be described below.

Referring to FIGS. 9 through 11, the source gas supply line, the purge gas supply line, and the reactive gas supply line in the second embodiment are substantially similar to those in the first embodiment, but the structure and connection relationship of the 4-way valve 154 is different. In detail, in the first embodiment, the 4-way valve 150 includes the first horizontal via hole 128b formed straight to be connected to the purge gas supply pipe 128a. In contrast, in the second embodiment, the 4-way valve 154 includes a second horizontal via hole 154f that communicates with a second inlet 154d of the 4-way valve 154 and bends at a right angle within the 4-way valve 154. A second vertical via hole 154h2 is formed extending from the middle of the second horizontal via hole 154f to a top surface of a body 154g of the 4-way valve 154. A first horizontal via hole 154e communicating with a first inlet 154c connected with the source gas supply pipe 122c is formed to bend at a right angle within the 4-way valve 154. A first vertical via hole 154h1 is formed extending from the middle of the first horizontal via hole 154e to the top surface of the body 154g.

As illustrated in FIG. 11, when the 4-way valve 154 is turned off, that is, when a diaphragm 154i moves down and closely contacts the top surface of the body 154g to close the upper ends of the first and second vertical via holes 154h1 and 154h2, the purge gas is supplied to the reaction chamber 110 via the second horizontal via hole 154f, and the source gas or the first carrier gas flowing in the source gas supply pipe 122c flows into the bypass 116 via the first horizontal via hole 154e. When the 4-way valve 154 is turned on, that is, when the diaphragm 154i moves up and is separated from the top surface of the body 154g to open the upper ends of the first and second vertical via holes 154h1 and 154h2, the purge gas flows into the reaction chamber 110 via the second horizontal via hole 154f or into the bypass 116 through the second horizontal via hole 154f, the second vertical via hole 154h2, a space between the top surface of the body 154g and the diaphragm 154i, and the first vertical via hole 154h1. When the fifth gate valve 152 is turned off, the purge gas flows only into the reaction chamber 110. Meanwhile, the source gas or the first carrier gas flowing in the source gas supply pipe 122c flows into the reaction chamber 110 through the first vertical via hole 154h1, the space between the surface of the body 154g and the diaphragm 154i, and the second vertical via hole 154h2 or into the bypass 116 through the first horizontal via hole 154e. Here, when the fifth gate valve 152 is turned off, the first carrier gas or the source gas flows only to the reaction chamber 110 through the first vertical via hole 154h1, the space between the surface of the body 154g and the diaphragm 154i, and the second vertical via hole 154h2.

The following describes in detail the closed and open states of each valve in each stage of a process of depositing a reaction product of the source gas and the reactive gas on a surface of a substrate using ALD.

In the source gas pulsing stage, the first gate valve 142 is turned off to be closed, a first outlet 132a of the first 3-way valve 132 is open, and a first inlet 134a and an outlet 134b of the second 3-way valve 134 are open, so that the first carrier gas and the source gas are simultaneously supplied. In addition, the fifth gate valve 152 installed at the bypass 116 is turned off and closed while the 4-way valve 154 is turned on, so that a gas flow to the bypass 116 is blocked and a gas flow is introduced to the reaction chamber 110. As a result, the source gas is supplied to the reaction chamber 110 together with the first carrier gas. Meanwhile, the purge gas is continuously supplied to the reaction chamber 110. The second carrier gas may be supplied to the reaction chamber 110 by closing the fourth gate valve 148 and opening the third gate valve 146.

Subsequently, in the source gas purging stage, the first gate valve 142 is open; the first outlet 132a of the first 3-way valve 132 is closed while a second outlet 132b of the first 3-way valve 132 is open; and the first inlet 134a of the second 3-way valve 134 is closed while the outlet 134b of the second 3-way valve 134 is open, so that the supply of the reactive gas is interrupted and the first carrier gas is allowed to flow. In addition, the fifth gate valve 152 installed at the bypass 116 is turned on while the 4-way valve 154 is turned off, so that the first carrier gas is discharged through the bypass 116. Accordingly, the source gas remaining between the second 3-way valve 134 and the 4-way valve 154 and between the 4-way valve 154 and the fifth gate valve 152 does not flow into the reaction chamber 110 but is discharged through the bypass 116 together with the first carrier gas. The source gas remaining in the reaction chamber 110 without being deposited is purged by the purge gas continuously supplied to the reaction chamber 110. Here, the second carrier gas may be continuously supplied to the reaction chamber 110 in a state where the fourth gate valve 148 is closed.

In the reactive gas pulsing and purging stages, similarly to the source gas purging stage, the first carrier gas is discharged through the bypass 116 and the purge gas is continuously supplied to the reaction chamber 110. However, in the reactive gas pulsing and purging stages, the fourth gate valve 148 installed at the reactive gas supply line and the third gate valve 146 are open so that the reactive gas is supplied to the reaction chamber 110 together with the second carrier gas.

Figure 12:
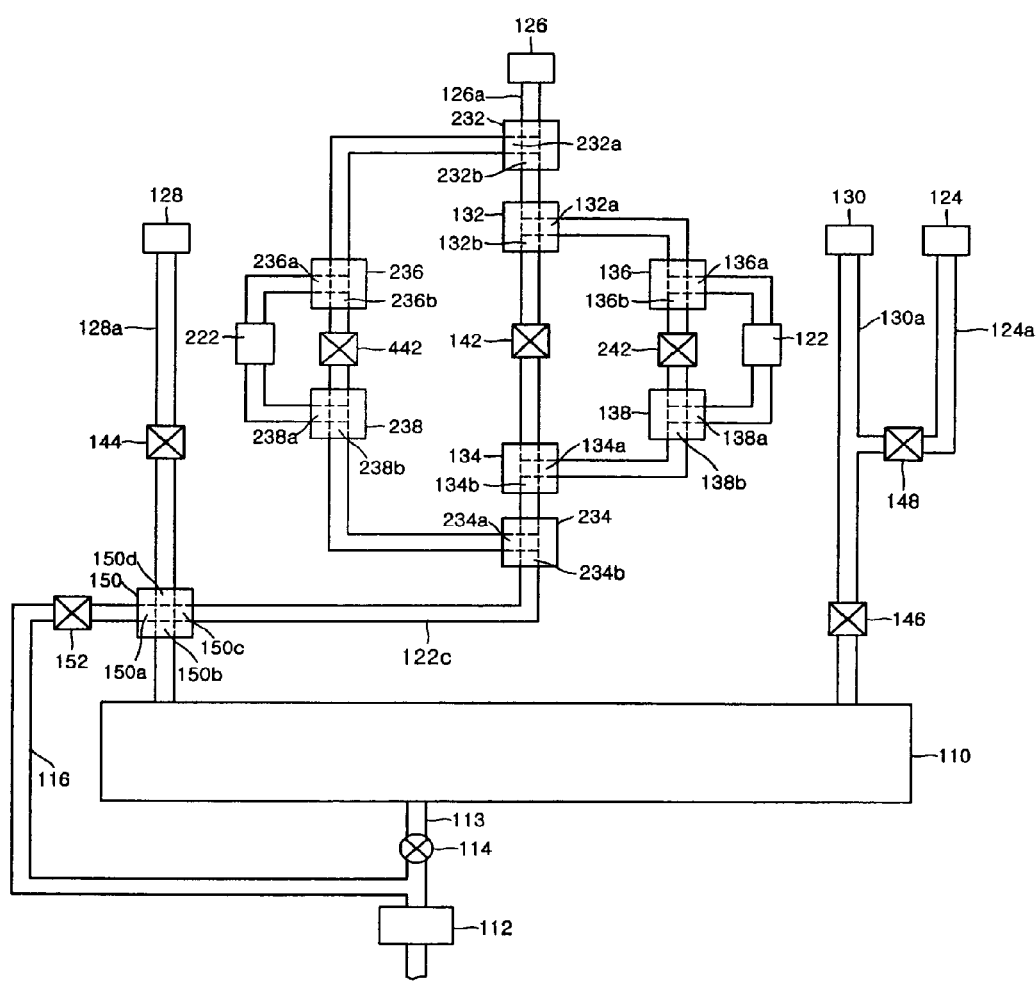
FIG. 12 is a schematic diagram illustrating an apparatus for fabricating a semiconductor device according to a third embodiment of the present invention.

FIG. 12 is a schematic diagram illustrating an apparatus for fabricating a semiconductor device according to a third embodiment of the present invention. The third embodiment is substantially similar to the first embodiment illustrated in FIGS. 5 through 8 but relates to a process of forming a multilayer or a complex layer on a substrate through ALD using different kinds of source gas. The difference between the first and third embodiments will be described below.

Referring to FIG. 12, each of two source gas supply sources 122 and 222 is installed together with the first carrier gas supply line to be parallel with the source gas supply pipe 122c and the two source gas supply sources 122 and 222 are disposed symmetrically. The apparatus illustrated in FIG. 12 is designed such that one of a first source gas and a second source gas is selectively supplied using a plurality of 2-way gate valves and 3-way valves. In the third embodiment, two kinds of source gas are supplied, but more than two kinds of source gas may be selectively supplied by disposing more than two source supply lines in parallel with the source gas supply pipe 122c.

In a first source gas supply line starting from the first source gas supply source 122 supplying the first source gas, the carrier gas is supplied from the first carrier gas supply source 126 through the first carrier gas supply pipe 126a to which the first source gas supply source 122 is connected in parallel through first through fourth 3-way valves 132, 134, 136, and 138. An on/off valve, i.e., the first 2-way gate valve 142, is installed at the first carrier gas supply pipe 126a between the first and second 3-way valves 132 and 134. An on/off valve, i.e., a second 2-way gate valve 242, is installed between the third and fourth 3-way valves 136 and 138. The first source gas supply source 122 is installed between the third and fourth 3-way valves 136 and 138 to be in parallel with the second 2-way gate valve 242.

In a second source gas supply line starting from the second source gas supply source 222 supplying the second source gas, the carrier gas is supplied from the first carrier gas supply source 126 through the first carrier gas supply pipe 126a to which the second source gas supply source 222 is connected in parallel through fifth through eighth 3-way valves 232, 234, 236, and 238. In detail, the fifth 3-way valve 232 is disposed between the first carrier gas supply source 126 and the first 3-way valve 132. The sixth 3-way valve 234 is disposed between the second 3-way valve 134 and the 4-way valve 150. The seventh 3-way valve 236 and the eighth 3-way valve 238 are installed at the second source gas supply line that is in parallel with the first carrier gas supply pipe 126a. An on/off valve, i.e., a third 2-way gate valve 442, is installed between the seventh and eighth 3-way valves 236 and 238. The second source gas supply source 222 is installed between the seventh and eighth 3-way valves 236 and 238 to be in parallel with the third 2-way gate valve 442.

In the third embodiment illustrated in FIG. 12, a single cycle of the source gas pulsing stage, the source gas purging stage, the reactive gas pulsing stage, and the reactive gas purging stage is performed using the first source gas, thereby depositing a thin reaction product of the first source gas and the reactive gas on a surface of a substrate. Thereafter, the cycle is repeated using the second source gas, thereby depositing a reaction product of the second source gas and the reactive gas on the reaction product of the first source gas and the reactive gas. Several through several thousands of cycles are performed while the first and second source gases are alternately supplied to form a complex layer on the surface of the substrate. For example, when the first source gas, the second source gas, the reactive gas, the reaction product of the first source gas and the reactive gas, and the reaction product of the second source gas and the reactive gas are represented by "A1", "A2", "B", "A1B", and "A2B", respectively, a layer deposited on the substrate according to the third embodiment of the present invention may be represented by "A1B/A2B/A1B/A2B . . . A1B/A2B".

The following describes in detail a process of depositing a reaction product of the source gas and the reactive gas on a surface of a substrate through ALD using the first and second source gases A1 and A2 and the reactive gas B. In performing the ALD process, a sequential set of a source gas pulsing stage, a source gas purging stage, a reactive gas pulsing stage, and a reactive gas purging stage is defined as one cycle and the cycles are repeated until a thin layer having a desired thickness is formed.

In a first source gas pulsing stage, the first source gas A1 is supplied to the reaction chamber 110 loaded with a wafer, i.e., the substrate (not shown), so that a first source gas material is attached to the surface of the substrate. Here, a second outlet 232b of the fifth 3-way valve 232 and an outlet 234b of the sixth 3-way valve 234 are open; the first 2-way gate valve 142 is turned off and closed; the first outlet 132a of the first 3-way valve 132 is open; the first inlet 134a and the outlet 134b of the second 3-way valve 134 are open while a first outlet 136a of the third 3-way valve 136 and an inlet 138a of the fourth 3-way valve 138 are open; and the second 2-way gate valve 242 is turned off, so that the first carrier gas and the first source gas A1 are supplied at the same time. In addition, the fifth gate valve 152 installed at the bypass 116 is turned off while the 4-way valve 150 is turned on, so that a gas flow to the bypass 116 is blocked and a gas flow is introduced to the reaction chamber 110. As a result, the first source gas A1 from the first source gas supply source 122 is supplied to the reaction chamber 110 together with the first carrier gas.

Subsequently, in the first source gas purging stage, source gas residues that are not attached to the surface of the substrate are removed from the reaction chamber 110. Here, the second outlet 232b of the fifth 3-way valve 232 and the outlet 234b of the sixth 3-way valve 234 are open; the first 2-way gate valve 142 is turned on and is open; the first outlet 132a of the first 3-way valve 132 is closed while the second outlet 132b of the first 3-way valve 132 is open; and the first inlet 134a of the second 3-way valve 134 is closed while the outlet 134b is open, so that the supply of the first source gas A1 is interrupted and the first carrier gas is allowed to flow. In addition, the fifth gate valve 152 installed at the bypass 116 is turned on while the 4-way valve 150 is turned off, so that the first carrier gas is discharged through the bypass 116. As a result, the first source gas A1 remaining between the second 3-way valve 134 and the 4-way valve 150 and between the 4-way valve 150 and the fifth gate valve 152 at the bypass 116 does not flow into the reaction chamber 110 but is discharged through the bypass 116 together with the first carrier gas. The first source gas A1 remaining in the reaction chamber 110 without being deposited is purged by the purge gas continuously supplied from the purge gas supply source 128 to the reaction chamber 110.

Subsequently, in the reactive gas pulsing stage, the reactive gas B is supplied into the reaction chamber 110 in a state where the first source gas A1 has been deposited on the surface of the substrate so that the first source gas A1 reacts with part of the reactive gas B, thereby forming the reaction product A1B on the surface of the substrate. Here, similarly to the first source gas purging stage, the first carrier gas is discharged through the bypass 116 and the purge gas is continuously supplied to the reaction chamber 110. However, in the reactive gas pulsing stage, the fourth gate valve 148 installed at the reactive gas supply line and the third gate valve 146 are open so that the reactive gas B is supplied to the reaction chamber 110 together with the second carrier gas supplied from the second carrier gas supply source 130.

Subsequently, in the reactive gas purging stage, the residues of the reactive gas B other than the reaction product A1B of the first source gas A1 and the reactive gas B deposited on the surface of the substrate are removed from the reaction chamber 110. Here, similarly to the first source gas purging stage, the first carrier gas is discharged through the bypass 116 and the purge gas is continuously supplied to the reaction chamber 110. However, in the reactive gas purging stage, the fourth gate valve 148 at the reactive gas supply line is closed to interrupt the supply of the reactive gas. As a result, only the second carrier gas is supplied to the reaction chamber 110.

In a second source gas pulsing stage, the second source gas A2 is supplied to the reaction chamber 110 so that a second source gas material is attached to the surface of the substrate on which the reaction product A1B has been formed. Here, the first outlet 132a of the first 3-way valve 132 and the first gate valve 142 are closed; a first outlet 232a of the fifth 3-way valve 232 is open; and a first outlet 236a of the seventh 3-way valve 236 is open. In this state, the first carrier gas and the second source gas A2 are simultaneously supplied to the reaction chamber 110 through the eighth 3-way valve 238 and the sixth 3-way valve 234 and through analogous open/closed states of valves as those in the first source gas pulsing stage.

A second source gas purging stage, the reactive gas pulsing stage, and the reactive gas purging stage are performed in the same manner as described above with respect to the first source gas, thereby forming the reaction product A2B on the reaction product A1B. In this way, when the cycle is repeated while the first and second sources gases A1 and A2 are alternately supplied, ALD is performed in the order of A1B, A2B, A1B, A2B . . . .

Figure 13:
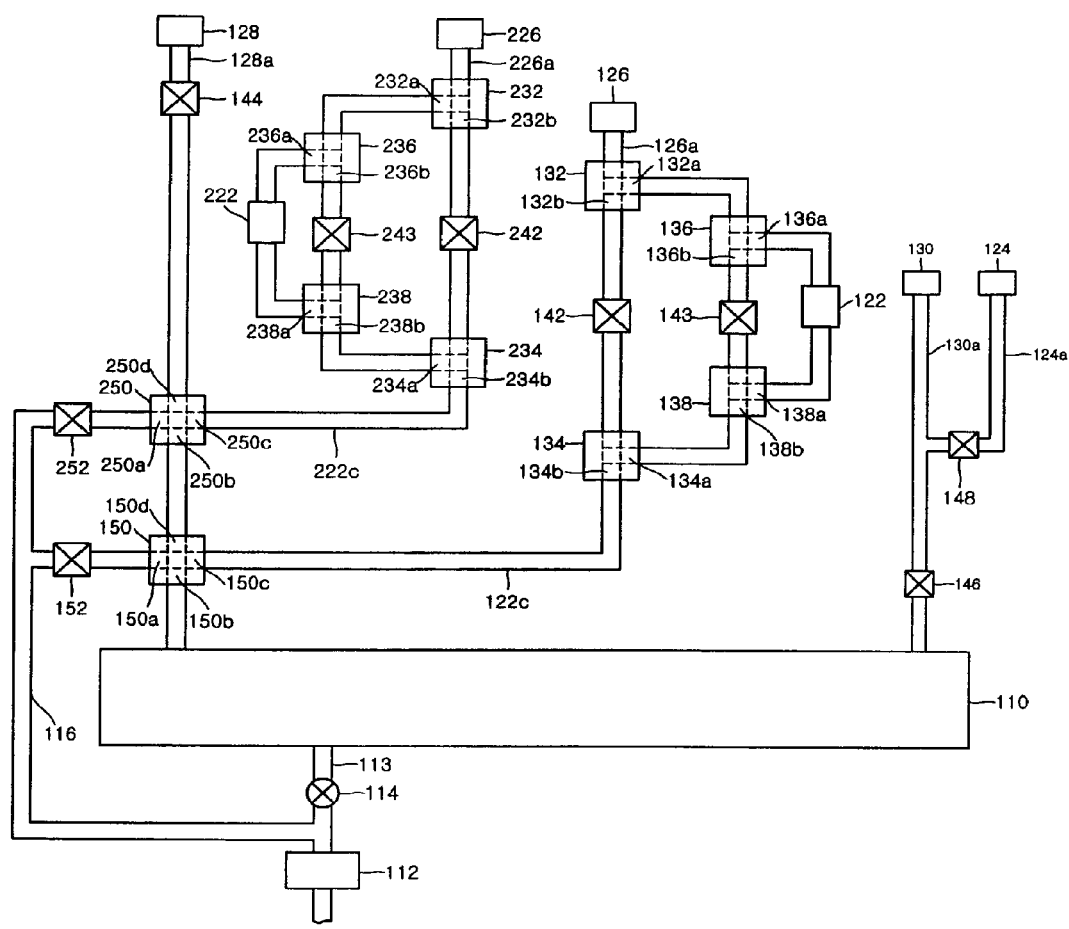
FIG. 13 is a schematic diagram illustrating an apparatus for fabricating a semiconductor device according to a fourth embodiment of the present invention.

FIG. 13 is a schematic diagram illustrating an apparatus for fabricating a semiconductor device according to a fourth embodiment of the present invention. In the third embodiment illustrated in FIG. 12, different kinds of source gases are supplied to the reaction chamber 110 through the one source gas supply pipe 122c and the one 4-way valve 150. However, in the fourth embodiment illustrated in FIG. 13, although the one purge gas supply pipe 128a is used to supply different kinds of source gases, the different kinds of source gases are separately supplied to the reaction chamber 110 through first and second source gas pipes 122c and 222c and first and second 4-way valves 150 and 250.

In a first source gas supply line, the carrier gas is supplied from the first carrier gas supply source 126 through the first carrier gas supply pipe 126a to which the first source gas supply source 122 is connected in parallel through first through fourth 3-way valves 132, 134, 136, and 138. An on/off valve, i.e., the first 2-way gate valve 142, is installed at the first carrier gas supply pipe 126a between the first and second 3-way valves 132 and 134. An on/off valve, i.e., a second 2-way gate valve 143, is installed between the third and fourth 3-way valves 136 and 138. The first source gas supply source 122 is installed between the third and fourth 3-way valves 136 and 138 to be in parallel with the second 2-way gate valve 143. A first source gas from the first source gas supply source 122 is connected to the first 4-way valve 150.

In a second source gas supply line, a carrier gas is supplied from a second carrier gas supply source 226 through a second carrier gas supply pipe 226a to which the second source gas supply source 222 is connected in parallel through the fifth through eighth 3-way valves 232, 234, 236, and 238. An on/off valve, i.e., the third 2-way gate valve 242, is installed at the second carrier gas supply pipe 226a between the fifth and sixth 3-way valves 232 and 234. An on/off valve, i.e., a fourth 2-way gate valve 243, is installed between the seventh and eighth 3-way valves 236 and 238. The second source gas supply source 222 is installed between the seventh and eighth 3-way valves 236 and 238 in parallel with the fourth 2-way gate valve 243. A second source gas from the second source gas supply source 222 is connected to the second 4-way valve 250. The first and second 4-way valves operate according to the same principle as that used in the first embodiment.

In a purge gas supply line, the purge gas is supplied from the purge gas supply source 128 to the reaction chamber 110 through the purge gas supply pipe 128a. The first 4-way valve 150 is installed at a junction of the purge gas supply pipe 128a and the first source gas supply pipe 122c. The second 4-way valve 250 is installed at a junction of the purge gas supply pipe 128a and the second source gas supply pipe 222c. The second gate valve 144 is installed between the purge gas supply source 128 and the second 4-way valve 250. In addition, gate valves 152 and 252 are installed at the bypass 116 connected with the first and second 4-way valves 150 and 250. A reactive gas supply line in the fourth embodiment is the same as those in the above-described embodiments.

The following describes in detail a process of depositing a reaction product of the source gas and the reactive gas on a surface of a substrate through ALD using the first and second source gases A1 and A2 and the reactive gas B, according to the fourth embodiment of the present invention.

In a first source gas pulsing stage, the first source gas A1 is supplied through the source gas supply pipe 122c in the same manner as that used in the third embodiment in a state where an inlet 250c of the second 4-way valve 250 is turned off.

Thereafter, a first source gas purging stage, a reactive gas pulsing stage, and a reactive gas purging stage are performed in the same manner as that used in the third embodiment, thereby forming a reaction product A1B on the surface of the substrate.

The first source gas line is blocked and a second source gas line is open to perform a second source gas pulsing stage. Here, the inlet 150c of the first 4-way valve 150 is closed and the inlet 250c of the second 4-way valve 250 is open.

Subsequently, a second source gas purging stage, the reactive gas pulsing stage, and the reactive gas purging stage are performed in the same manner as that performed with respect to the first source gas A1, thereby performing ALD in order of A1B, A2B, A1B, A2B, . . . .

Figure 14:
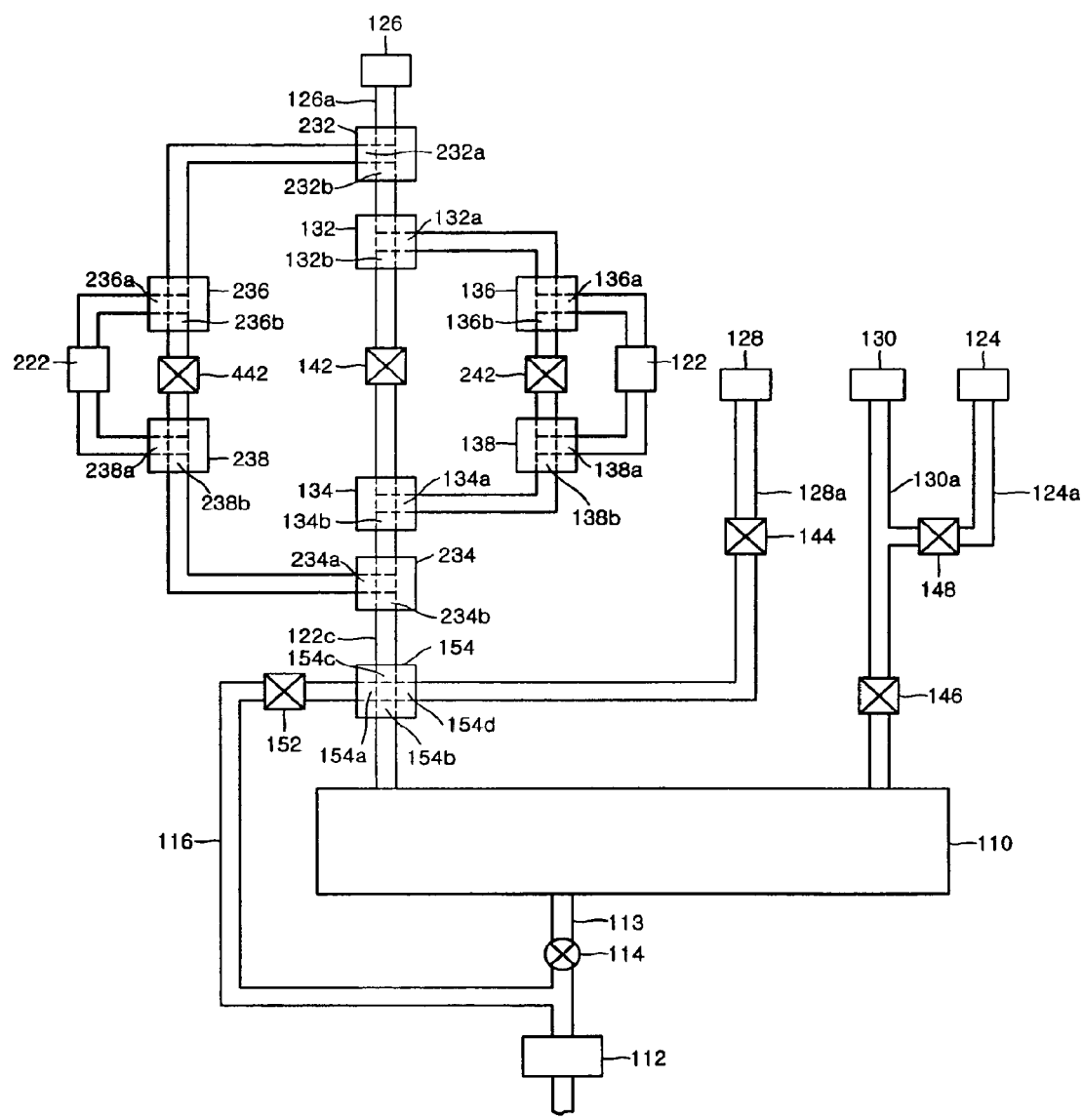
FIG. 14 is a schematic diagram illustrating an apparatus for fabricating a semiconductor device according to a fifth embodiment of the present invention.

FIG. 14 is a schematic diagram illustrating an apparatus for fabricating a semiconductor device according to a fifth embodiment of the present invention. An operating principle of the 4-way valve 154 in the fifth embodiment is the same as that in the second embodiment. In addition, the fifth embodiment is the same as the third embodiment in that different kinds of source gases are selectively supplied through the single source gas supply pipe 122c. Thus, a detailed description of the fifth embodiment will not be repeated.

Figure 15:
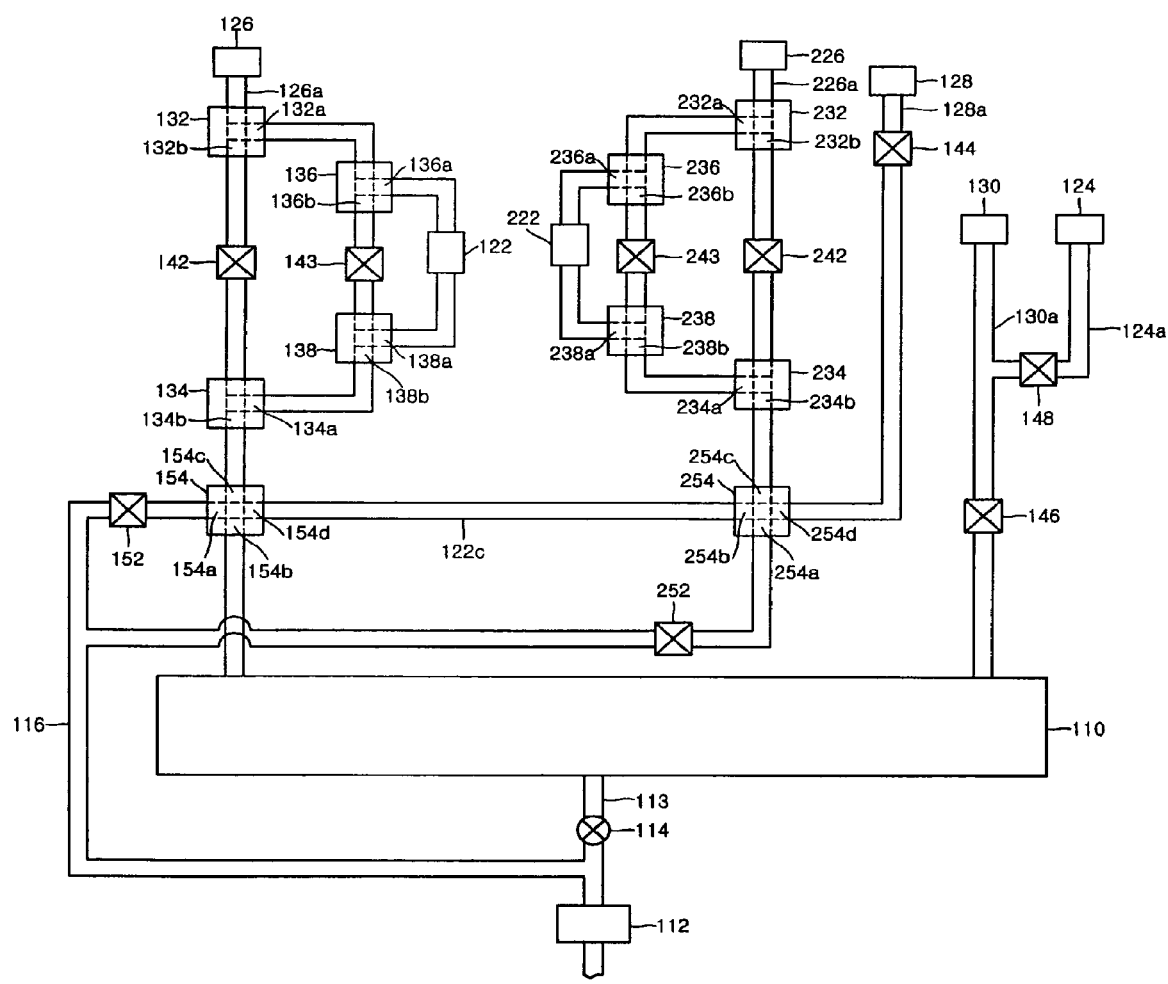
FIG. 15 is a schematic diagram illustrating an apparatus for fabricating a semiconductor device according to a sixth embodiment of the present invention.

FIG. 15 is a schematic diagram illustrating an apparatus for fabricating a semiconductor device according to a sixth embodiment of the present invention. An operating principle of the first and second 4-way valve 154 and 254 in the sixth embodiment is the same as that in the second embodiment. In addition, the sixth embodiment is the same as the fourth embodiment in that different kinds of source gases are selectively supplied through different source gas supply lines, respectively. Thus, a detailed description of the sixth embodiment will not be repeated.

In the third through sixth embodiments of the present invention, as described above, a complex layer is formed on a substrate through ALD using two kinds of source gases. However, more than two kinds of source gases may be selectively supplied when necessary. In addition, at least two kinds of reactive gases may be selectively used. Here, to increase purge efficiency, a reactive gas supply line may use the same gas valve system as a source gas supply line.

Moreover, in the third through sixth embodiments of the present invention, according to the foregoing description, an ALD cycle using a first source gas alternates with an ALD cycle using a second source gas. However, a plurality of ALD cycles using the first source gas may be performed to form a first thin layer to a predetermined thickness, and then a plurality of ALD cycles using the second source gas may be performed to form a second thin layer to a predetermined thickness on the first thin layer.

For example, when a first source gas, a second source gas, a first reactive gas, a second reactive gas, a reaction product of the first source gas and the first reactive gas, and a reaction product of the second source gas and the second reactive gas are represented by "A1", "A2", "B1", "B2", "A1B1", and "A2B2", respectively, a layer deposited on a substrate according to embodiments of the present invention may have diverse structures represented by "A1B1/A2B2/A1B1/A2B2 . . . A1B1/A2B2", "A1B1/A1B2/A1B1/A1B2 . . . A1B1/A1B2", "A1B1/A1B1 . . . /A1B1/A2B2/A2B2 . . . A2B2", etc. according to a combination of a source gas and a reactive gas.

Different kinds of source gases are supplied using the two 4-way valves 150 and 250 in the fourth embodiment of the present invention and the two 4-way valves 154 and 254 in the sixth embodiment of the present invention. Here, a stickier source gas among the first and second source gases may be supplied through a source gas supply line nearer to the reaction chamber 110. Generally, $ZrO_2$ is stickier than $HfO_2$ and $HfO_2$ is stickier than $Al_2O_3$.

To prove that dead volume is eliminated from a valve system according to the present invention, HfO layers and AlO layers were formed using ALD according to the first embodiment. Table 1 shows the characteristics of the layers.

TABLE 1

|  | Switching information (27 MHz) | Number of cycles | Thickness (Å) | Uniformity (%) | Deposition rate (Å/cycle) | Maximum/ Minimum |
|---|---|---|---|---|---|---|
| HfO | ①0.3/0.5/0.2/1.0/0.2 | 100 | 91.33 | 1.48 | 0.91 | 92.88/90.19 |
|  | ②(0.3/0.5/0.2/1.0/0.2) + 1.0/0.5/0.2/1.0/0.2 | 100 | 88.66 | 1.29 | 0.89 | 89.97/87.68 |
| AlO | ③0.1/0.3/1.0 | 100 | 141.25 | 1.68 | 1.41 | 143.09/138.34 |
|  | ④(0.1/0.3/1.0) + 1.0/0.3/1.0 | 100 | 142.38 | 1.52 | 1.42 | 143.95/139.63 |

In Table 1, (1) and (2) denote cases where a HfO layer is formed using ALD: case (1) is a result of performing 100 cycles of source gas pulsing (0.3 seconds)/source gas purging (0.5 seconds)/oxygen pre-pulsing (0.2 seconds)/oxygen plasma (0.1 second)/oxygen purging (0.2 seconds); and case (2) is a result of additionally performing a cycle that does not supply a source gas between cycles that supply the source gas. The result (2) proves that dead volume does not occur and uniformity is not degraded in the valve system according to the present invention.

Similarly, results (3) and (4) of forming an AlO layer using ALD also prove that dead volume does not occur in the valve system according to the present invention.

As described above, according to the present invention, a source gas remaining in a supply pipe of a source gas supply line is not allowed to flow into a reaction chamber but is discharged through a bypass, thereby preventing dead volume. Therefore, an additional load of purging dead volume occurring in conventional technology is eliminated. As a result, fabrication of semiconductor devices can be performed more reliably.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of forming a semiconductor using atomic layer deposition, the method comprising:
   supplying a source gas through a first path to a chamber;
   supplying a carrier gas through a second path including a bypass to a discharge pump;
   supplying a reactive gas through a third path to the chamber; and
   supplying a purge gas through a fourth path to the chamber,
   wherein the second path and the fourth path intersect, and
   wherein the carrier gas is supplied to the discharge pump through the bypass of the second path.

2. The method of claim 1, wherein a portion of the first path and a portion of the second path converge to share a common path so that the carrier gas purges the source gas from the common path.

3. The method of claim 1, wherein the carrier gas purges the source gas from the first path and the purge gas purges the source gas and the reactive from the chamber.

4. The method of claim 1, wherein the first path, the second path and the fourth path intersect at a valve.

5. The method of claim 4, wherein the valve is a 4-way diaphragm valve.

6. The method of claim 5, wherein the first path passes through a first inlet and a first outlet of the 4-way diaphragm valve,
   the second path passes through the first inlet and a second outlet of the 4-way diaphragm valve, and
   the fourth path passes through a second inlet and the first outlet of the 4-way diaphragm valve.

7. The method of claim 4, wherein the source gas is supplied through the first path to the chamber when the 4-way diaphragm valve is set in a first state, and
   the carrier gas is supplied through the second path to the discharge pump when the 4-way diaphragm valve is set in a second state.

8. The method of claim 7, wherein the purge gas is continuously supplied to the chamber when the valve is set to the first state and when the valve is set to the second state.

* * * * *